(12) United States Patent
Weng et al.

(10) Patent No.: US 6,651,214 B1
(45) Date of Patent: Nov. 18, 2003

(54) BI-DIRECTIONAL DECODABLE REED-SOLOMON CODES

(75) Inventors: Lih-Jyh Weng, Shrewsbury, MA (US); Dana E. Hall, Hopkinton, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/479,312

(22) Filed: Jan. 6, 2000

(51) Int. Cl.$^7$ .......................... G11C 29/00; H03M 13/00
(52) U.S. Cl. .......................................... 714/771; 714/784
(58) Field of Search .................................. 714/771, 784

(56) References Cited

U.S. PATENT DOCUMENTS

| | | | | |
|---|---|---|---|---|
| 3,800,281 A | * | 3/1974 | Devore et al. | 714/755 |
| 3,811,108 A | * | 5/1974 | Howell | 714/785 |
| 3,868,632 A | * | 2/1975 | Hong et al. | 714/755 |
| RE30,187 E | * | 1/1980 | Hong et al. | 714/758 |
| 4,201,976 A | * | 5/1980 | Patel | 714/804 |
| 4,551,840 A | * | 11/1985 | Fujii et al. | 714/771 |
| 4,870,645 A | * | 9/1989 | Herron | 714/755 |
| 4,884,274 A | * | 11/1989 | Rather | 714/812 |
| 5,469,448 A | * | 11/1995 | Denissen et al. | 714/755 |
| 5,621,578 A | * | 4/1997 | Matsumi et al. | 360/15 |

FOREIGN PATENT DOCUMENTS

| | | | | |
|---|---|---|---|---|
| GB | 2018095 A | * | 10/1979 | G06F/11/12 |

* cited by examiner

Primary Examiner—Albert Decady
Assistant Examiner—Joseph D. Torres
(74) Attorney, Agent, or Firm—Daly, Crowley & Mofford, LLP

(57) ABSTRACT

A bidirectional code decoding method and apparatus is presented. It uses a class of Reed-Solomon codes capable of bidirectional decoding, more specifically, those for which a value of L for a Galois Field element $\alpha^L$ is chosen as $-(R-1)/2$ for odd values of R and $2^{(m-1)}-R/2$ for even values of R. When the symbols of such codes are received at a decoder in a reverse order (from that in which the symbols are normally received) during a reverse directional read, the decoder produces reverse directional syndromes $S^\sim(-k)$ and converts the reverse directional syndromes $S^\sim(-k)$ to syndromes $S(k)$ by multiplying $S^\sim(-k)$ by $\alpha^{(n-1)k}$ for k=L, L+1, . . . , L+R-1. Alternatively, the decoder adjusts error location values for errors occurring in reverse order code word symbols to correspond to error location values that correspond to an error locations that would be determined if the symbols were to be received in the order in which the symbols are normally received.

41 Claims, 4 Drawing Sheets

BI-DIRECTIONAL DECODABLE REED-SOLOMON CODES

BACKGROUND OF THE INVENTION

The invention relates generally to error correction code decoding mechanisms and, more particularly, to the decoding of Reed-Solomon error correction codes.

The use of increasingly higher density storage media in digital computer systems has caused an increase in the potential for defect-related data errors. To reduce data loss as a result of such data corruption, error correction codes are employed to correct the erroneous data.

Prior to storing data on a storage device, such as a magnetic disk or tape, it is encoded to form redundancy symbols. The redundancy symbols are appended to the data symbols to form code words, which are then stored on the storage device. When the stored data is retrieved from the storage device for decoding, the redundancy symbols provide information which allows the decoder to recognize errors and, if possible, reconstruct the original code word. For a detailed description of decoding, see "Error-Correcting Codes," Second Edition, by W. Wesley Peterson and E. J. Weldon, Jr. (MIT Press, 1972). One widely-used error correction code is the Reed-Solomon code.

To correct errors, a Reed-Solomon decoder must determine the locations and values (or magnitudes) of the detected errors. The decoder first computes error syndromes, which it then uses to generate an error locator polynomial. Once the error locator polynomial has been generated, each error location and value may be determined.

Error locations are determined by solving for the roots of the error locator polynomial $\sigma(x)$ of degree t or less, where t is the number of errors that can be corrected. The solution or roots of the equation $\sigma(x)=0$ correspond to the locations of the errors. These roots are of the form $x=\alpha^i$, where $\alpha$ is the primitive element of the Galois Field $GF(p^q)$ used to encode the data. Once all t roots have been found, the corresponding error values are calculated using the well-known Forney algorithm. The data can then be corrected to produce an error-free data symbol.

Some storage devices, such as magnetic tape, are capable of being read in a forward direction or a reverse direction. Some tape drives, such as nine track tape drives, use vertical code "slices", for which a forward and reverse read is the same. Forward and reverse reads for longitudinal codes, such as the Reed-Solomon codes, are not the same. That is, the ordering of the code word symbols is reversed, which, in turn, reverses the order in which code word symbols are provided to the decoder. Prior data storage systems which store Reed-Solomon code words on tape drives read as well as decode the code words unidirectionally, or more specifically, in a forward direction only. To date, in order to read an n-symbol code word stored at a location prior to the current location of the head, the data storage system must rewind the tape to the beginning of the code word (i.e., symbol 0) and perform a read in the forward direction from symbol 0 to symbol n−1. These symbols are provided to the Reed Solomon decoder in the order in which they are read. Other storage systems which are designed to execute a "reverse read" command also rewind to the beginning of the code word to be read, and then read as well as decode that code word in a forward direction.

SUMMARY OF THE INVENTION

In general, the invention relates to a class of longitudinal codes which can be decoded during reads in both a forward direction and a reverse direction.

In one aspect of the invention, processing a code word includes receiving from a storage device symbols of a code word in a reverse order from that in which the symbols are normally received and performing a decoding procedure on the reverse order symbols.

Embodiments of the invention may include one or more of the following features.

The code word is a Reed-Solomon code word.

Performing the decoding procedure on the reverse order symbols of the Reed-Solomon code word includes generating reverse directional syndrome values from the reverse order symbols and converting the reverse directional syndrome values to syndrome values that correspond to syndrome values that would be generated for the symbols if the symbols were received in the order in which the symbols are normally received.

The code word is an m-bit n-symbol code word having R redundancy symbols, and a value of L associated with the code word is defined as $-(R-1)/2$ for odd values of R and $2^{(m-1)}-R/2$ for even values of R. Converting includes multiplying a first one of the reverse directional syndrome values by a first Galois field element $\alpha$ of a power $(n-1)*L$, storing the result as a product value, and, for each successive one of the reverse directional syndrome values, updating the product value by multiplying the product value by a second field element $\alpha$ of a power $n-1$.

Alternatively, performing the decoding procedure on the reverse order symbols includes determining that an error has occurred in at least one of the reverse order symbols, determining an error location for the error and adjusting the error location for the at least one of the reverse order symbols to an error location that corresponds to an error location that would be determined if the symbols had been received in the order in which the symbols are normally received.

In yet another alternative, performing the decoding procedure on the reverse order symbols includes determining error locator polynomial coefficients from the reverse directional syndromes and reversing the order in which the error locator coefficients are applied to an error location computation unit.

Processing a code word further includes receiving from a storage device symbols of a code word in an order in which the symbols are normally received and performing a decoding operation on the symbols.

In another aspect of the invention, processing a code word stored on a storage device includes reading symbols of the code word from a storage device in an order in which the symbols are normally read or a in a reverse order from that in which the symbols are normally read, and decoding the code word. Processing the code word further includes determining that the symbols are read in a reverse order from that in which the symbols are normally read. If it is determined that the symbols are read in the reverse order, then performing a decoding procedure on the code word.

Among the advantages of the bidirectional decoding mechanism of the present invention are the following. For storage devices such as tape drives, the data transfer rate can be increased by reading data in both forward and backward directions. That is, the tape drive does not have to rewind to the beginning of a code word in order to read and decode that code word. The bidirectional read capability is made practical given the flexibility of decoding the data as it is read from the tape in one direction or the other. Additionally, the mechanism offers a way to share decoder circuitry for both directions without a significant increase in decoding complexity.

Other features and advantages of the invention will be apparent from the following detailed description and from the claims.

DETAILED DESCRIPTION

The present invention features a mechanism for decoding Reed-Solomon code words whose symbols are read in an order in which the symbols are normally read (referred to hereafter as a forward order) as well as code words whose symbols are read in a reverse order from that in which the symbols are normally read (referred to hereafter as a reverse order). The mechanism uses a class of codes defined by a particular selection of the Galois Field element $\alpha^L$. In one embodiment, syndrome values generated for reverse order code word symbols are converted to syndrome values which would be generated for the same code word symbols if processed in a forward order (forward order code word symbols), also referred to herein as forward directional syndrome values. In another embodiment, error location values determined for reverse order code word symbols are likewise modified to give the same results that would be achieved for those symbols in a forward order. Both of the embodiments will be described.

Figure 1:
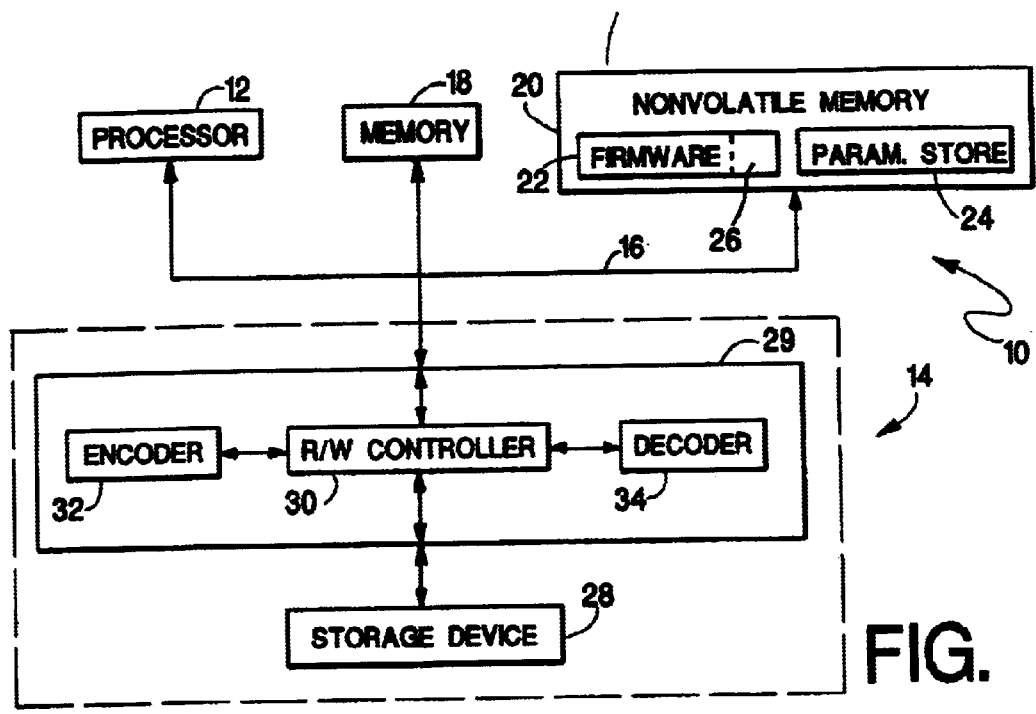
FIG. 1 is an block diagram of an exemplary data storage system which employs a bidirectional Reed-Solomon decoder for decoding code words whose symbols are read in an order in which the symbols are normally read (forward order code words) as well as code words whose symbols are read in a reverse order from that in which the symbols are normally read (reverse order code words).

Referring to FIG. 1, an exemplary data storage system is shown. The data storage system 10 includes a processor 12 coupled to a mass storage system 14 by way of a bus 16. Also connected to bus 16 are a memory 18 and a nonvolatile memory 20. The processor 12 controls the overall operation of the data storage system 10 and communicates with the memory 18 and the mass storage system 14 over the bus 16. The nonvolatile memory 20 stores system firmware 22 and parameter data in a parameter store 24, and is read each time the data storage systems 10 boots. Stored in the memory 18 are data structures created and maintained by the firmware processes as executed by the processor 12. The memory 18 also stores data read from the mass storage system 14.

The mass storage system 14 includes a storage controller 29, which is coupled to a storage device 28. The storage device is of the type that performs bidirectional reads, such as a magnetic tape and associated drive unit. Included in the controller 29 are a read/write controller 30, along with an encoder 32 and a decoder 34. The encoder 32 and decoder 34 may be implemented as separate circuits or may share the same circuitry. The read/write (R/W) controller 30 supervises the recording of data on and retrieval of data from the storage device 28. It also directs the encoder 32 to encode data written to the storage device 28 and directs the decoder 34 to decode the coded data as it is read back from the storage device 28. In the described embodiment, the encoder and decoder (32 and 34, respectively), are of the Reed-Solomon type. The encoder 32 is configured to perform conventional Reed-Solomon encoding algorithms. The decoder 34 also performs conventional Reed-Solomon decoding algorithms, but is suitably modified to perform decoding algorithms on coded data that is read from the storage device 28 in either a forward or reverse direction, as will be described.

Figure 2:
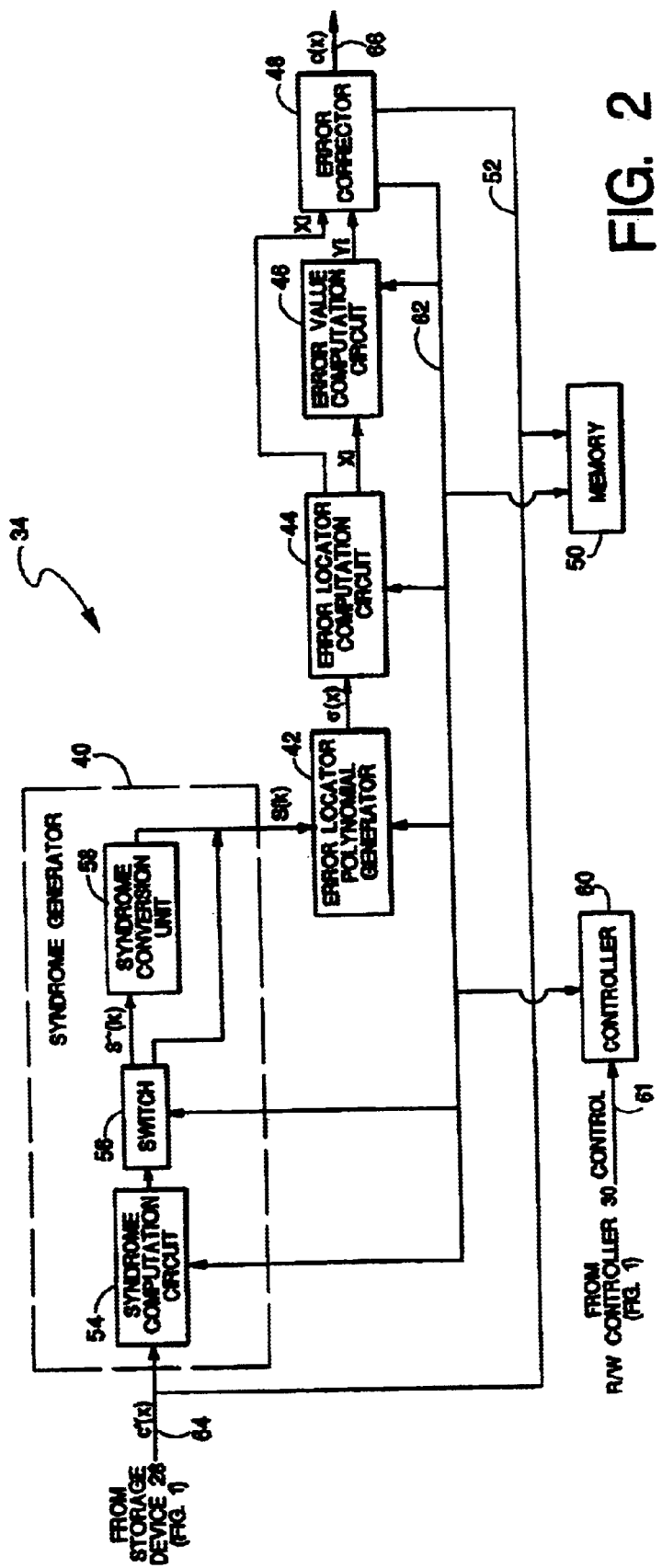
FIG. 2 is a block diagram of the bidirectional Reed-Solomon decoder (of FIG. 1), the bidirectional decoder having a syndrome generator which includes conventional syndrome computation circuitry as well as a syndrome conversion unit.

Referring to FIG. 2, the decoder 34 includes an arrangement of functional units, including a syndrome generator 40, an error locator polynomial generator 42, an error location computation (or root finding) circuit 44, an error value computation unit 46 and an error corrector 48. Also included is a memory 50 for storing a copy of a received code word received on a data bus 52. The memory 50 stores the received code word while the locations and values of detected errors of the received codeword are being computed by units 40, 42, 44 and 46, collectively. The units 42, 44, 46 and 48 are conventional decoder blocks, the details of which are largely omitted herein. The syndrome generator 40 includes a conventional syndrome computation circuit 54, as well as a switch 56 and a syndrome conversion unit 58, which will be described in detail below. Control of each of these functional units 40, 42, 44, 46 and 48 is effected by a controller 60, which operates in accordance with control signals 61 received from the R/W controller (shown in FIG. 1). The control signals 61 indicate to the controller 60 whether the received input code word was read from the storage device 28 in a forward direction or reverse direction. Decoding control signals are provided to the functional units by the controller 60 over a control bus 62.

The decoder 34 receives as an input a codeword c(x), which may contain some error e(x), from the storage device 28 (shown in FIG. 1). The received (corrupted) code word, i.e., c(x)+e(x), is referred to as c'(x). It will be appreciated that c'(x)≠c(x) when there is at least one bit in a symbol c'$_j$, which differs from the corresponding bit of the corresponding symbol c$_j$. The code word c(x) of n symbols includes k information or data symbols d(x) and R (i.e., "n–k") redundancy symbols r(x). Each of the symbols is m bits in length. The redundancy symbols are derived by dividing the information symbols by a generator polynomial g(x). Division results in a quotient q(x), which is ignored, and a remainder r(x). The remainder includes the redundancy symbols which are then added to the n–k lowest order locations of c(x). With Reed-Solomon codes, the number of redundancy symbols R to correct an error must be at least twice the number of errors t that are to be corrected; thus, there must be R≧2t redundancy symbols in a t-error-correcting code. As the order of the remainder corresponds to the order of the divisor, the generator polynomial implemented for a t error correcting Reed-Solomon code having n≦2$^m$−1, m-bit symbols is as follows:

$$g(x)=(x-\alpha^L)(x-\alpha^{L+1})\ldots(x-\alpha^{L+r-1}) \qquad \text{Eq. (1)}$$

where $\alpha^i$ for I=L, L+1, ... L+r−1, is a field element of GF(2$^m$) and L is a constant of the Galois field factor (x−a$^i$).

The code word c(x) is a multiple of both the generator polynomial and each of its factors or roots. Thus, the division of the received word c'(x) by the generator polynomial g(x) or each of its roots, if the received word contains no errors, results in some quotient and a remainder of zero.

In general, with reference to Eq. 1, the value of L can be arbitrarily selected. For bi-directional decodable codes, as used by the bidirectional decoder 34, the values of L are restricted to $$L = -(R-1)/2 \text{ for odd values of } R \quad \text{Eq. (2a)}$$

$$L = 2^{(m-1)} - R/2 \text{ for even values of } R \quad \text{Eq. (2b)}$$

With either choice, the exponent of the j'th root plus the exponent of the j'th root from the last root is equal to zero. Explicitly, for odd values of R: $(L+j)+[(L+R-1)-j]=2L+R-1=[-(R-1)]+(R-1)=0$. Similarly, for even values of R: $(L+j)+[(L+R-1)-j]=2L+R-1=2[2^{(m-1)}-R/2]+R-1=2^m-R+R-1=2^m-1=0 \mod 2^m-1$.

Using the notation $-j$ to mean $2m-1-j$, Eq. (1) can be rewritten as $$g(x)=(x+\alpha^{-(R-1)/2})(x+\alpha^{-[(R-1)/2]+1}) \ldots (x+\alpha^0) \ldots (x+\alpha^{[(R-1)/2]-1})(x+\alpha^{(R-1)/2}) \quad \text{Eq. (1'a)}$$

for odd values of R, and $$g(x)=(x+\alpha^{p-R/2})(x+\alpha^{[p-R/2]+1}) \ldots (x+\alpha^{[p+R/2]-1})(x+\alpha^{p+R/2}) \quad \text{Eq. (1'b)}$$

where $p=2^{(m-1)}$, for even values of R. Eq. 1'b can be rewritten as $$g(x)=(x+\alpha^{p-R/2})(x+\alpha^{[p-R/2]+1}) \ldots (x+\alpha^{-([p+R/2]+1)})(x+\alpha^{-(p-R/2)}) \quad \text{Eq. (1''b)}$$

to explicitly show that the j'th root is equal to the "negative" value of the j'th root from the last root for $j=0, 1, \ldots, R/2-1$.

Still referring to FIG. 2, the received codeword c'(x), defined above as c(x)+e(x) where c(x) is generated by g(x) for a selected value of L in accordance with Equation 2(a) or 2(b), is applied to the syndrome generator 40 over an input bus 64. For error correction purposes, it is necessary to generate a number of syndromes equal to twice the number of errors being corrected. The syndrome is defined as the remainder after dividing the received word c'(x) by a root $(x-\alpha^i)$ of the generator polynomial g(x). This is the equivalent of evaluating the received polynomial c'(x) at $\alpha^i$, i.e., $c'(\alpha^i)$. As there are R such roots, there are R syndromes. The syndromes are mathematically related to error locations and error values by the relationship:

$$S(k) = \sum_{0}^{t-1} Y_i X_i^k \quad \text{Eq. (3)}$$

where $X_i$ are the error locations and the $Y_i$ are the error values, and $S(k)=c'(\alpha^k)$. $X_i$ is an element of the Galois Field and the power of $\alpha$ corresponds to the location of the symbol error, i.e., if $X_i=\alpha^{83}$, the 83rd symbol is in error. The value of $Y_i$ is also an element of Galois Field $GF(2^m)$ and corresponds to the error pattern.

Therefore, the received code word c'(x) is tested for the presence of errors by computing syndromes, $S(k)=c'(\alpha^k)$, where $k=L, L+1, \ldots, L+R-1$. If all syndromes S(k) are zero, then there is no error and therefore no need for further decoding. If at least one S(k) is nonzero, the codeword c'(x) must be subject to further processing by the decoder 34.

During a decoding process, the controller 60 directs the syndrome generator 40 to provide the computed syndromes to the error locator polynomial generator 42, which calculates the coefficients of an error locator polynomial from the computed syndromes according to known algorithms, such as the Berlekamp-Massey or Euclidean algorithms. The error locator polynomial is of the form:

$$\sigma(x)=\sigma_t x^t + \sigma_{t-1} x^{t-1} + \sigma_{t-2} x^{t-2} + \sigma_{t-3} x^{t-3} + \sigma_2 x^2 + \sigma_1 x + \sigma_0 \quad \text{Eq. (4)}$$

for a t-error correcting code.

The coefficients of the error locator polynomial $\sigma(x)$ generated by the error locator polynomial generator 42 are transferred to the error location computation circuit 44. The error location computation circuit 44 evaluates $\sigma(x)$ for each power of $\alpha^j$, $j=0, 1, 2, 3, \ldots, n-1$ (n being the total number of symbols in the codeword c'(x)) and determines if the result is zero or non-zero. The values of $\sigma(x)$ equal to zero correspond to error locations $X_i$, which are provided to the error values computation unit 18 and the error corrector 20, as shown.

Still referring to FIG. 2, the error values computation unit 46 receives as inputs the error locations $X_i$ and the syndromes Si and computes error values $Y_i$ using known techniques, such as the well-known Forney algorithm.

The error corrector 48 receives the codeword c'(x) from the memory 50, along with each error location $X_i$ and error value $Y_i$ from the error location computation circuit 44 and the error values computation unit 46, respectively. It adds the error value $Y_i$ to the corresponding erroneous symbol read from the error location $X_i$ to produce on an output bus 66 an error-free symbol of codeword c(x).

In the forward direction, the symbol $c'_{j+1}$ precedes $c'_j$ in the order in which the symbols are applied to the syndrome generator 40, as shown in FIG. 2. Alternately, the forward direction may be defined so that $c'_j$ precedes $c'_{j+1}$. The forward directional syndromes S(k) computed for the forward order code word symbols are defined to be:

$$S(k) = \sum_{j=0}^{n-1} \{(\alpha^j) * c'_j\} \text{ for } k = L, L+1, \ldots, L+R-1 \quad \text{Eq. (5)}$$

where the summation is done over j from 0 to $n-1$ and $c'_j$ is the retrieved $j^{th}$ code word symbol. It is clear that if a function is defined as $$c'(x)=c'_{n-1} x^{n-1} + c'_{n-2} x^{n-2} + \ldots + c'_2 x^2 + c'_1 x + c'_0 \quad \text{Eq. (6)}$$

then the syndrome value S(k) is $c'(\alpha^k)$. It should be noted that S(-k) is the same as $S(2^m-1-k)$ for all k. Also, for both even and odd R, when $k=L+j$, then $-k=2^m-1-L-j=L+R-1-j$ for all j.

The syndromes generated with reverse order of $c'_j$ are referred to as reverse directional syndromes S~[k], which are represented as $$S^\sim(k) = \sum_{j=0}^{n-1} \{(\alpha^j)^k * c'_{n-1-j}\} \quad \text{Eq. (7)}$$

for $k = L, L+1, \ldots, L+R-1$

Using a new variable $E=n-1-j$ and letting $j=n-1-0$, Eq. (7) becomes $$S\tilde{\ }(k) = \sum_{\theta=n-1}^{0} \{(\alpha^{n-1-\theta})^k * c'_\theta\} \quad \text{Eq. (7a)}$$

for $k = L, L+1, \ldots, L+R-1$

Interchanging the limits of $\theta$, Eq. (5a) becomes $$S\tilde{\ }(k) = \sum_{\theta=0}^{n-1} \{(\alpha^{n-1-\theta})^k * c'_\theta\} \quad \text{Eq. (7b)}$$

for $k = L, L+1, \ldots, L+R-1$

Factoring out the common factors $\alpha^{(n-1)k}$, Eq. (7b) becomes $$S\tilde{\ }(k) = \alpha^{(n-1)k}\sum_{\theta=0}^{n-1} \{(\alpha^{-\theta})^k * c'_\theta\} \quad \text{Eq. (7c)}$$

for $k = L, L+1, \ldots, L+R-1$

Since $(\alpha^{-\theta})^k = (\alpha^\theta)^{-k}$, Eq. (7c) becomes $$S\tilde{\ }(k) = \alpha^{(n-1)k}\sum_{\theta=0}^{n-1} \{(\alpha^\theta)^{-k} * c'_\theta\} \quad \text{Eq. (7d)}$$

for $k = L, L+1, \ldots, L+R-1$

Comparing Eq. (7d) and Eq. (5), it is observed that $$S\tilde{\ }(k) = \alpha^{(n-1)k}S(-k) \quad \text{Eq. (8)}$$

or $$S\tilde{\ }(-k) \; \alpha^{(n-1)(-k)}S(k) \quad \text{Eq. (9)}$$

where $S\tilde{\ }(-k)$ are the reverse directional syndromes for negative values of k.

Multiplying both sides of Eq. (9) by a proper normalization factor, $\alpha^{(n-1)k}$, yields $$S(k) = \alpha^{(n-1)k}S\tilde{\ }(-k) \text{ for } k=L, L+1, \ldots, L+R-1 \quad \text{Eq. (10)}$$

Therefore, S(k) may be determined from S~(k) for this class of Reed-Solomon codes according to relationship expressed by Eq. (10) above. For example, for R=9, L=−(R−1)/2=−8/2=−4, and the reverse directional syndromes S~(k) computed by the syndrome computation circuit 54 are S~(−4), S~(−3), S~(−2), S~(−1), S~(0), S~(1), S~(2), S~(3) and S~(4). Thus, S(−4) is determined from S~(4), S(−3) from S~(3) . . . S(0) from S~(0), . . . , S(4) from S~(−4).

As shown in FIG. 2, to accommodate reverse order coefficients retrieved from the storage device 28 (FIG. 1) during a reverse directional read operation, the controller 60 controls the switch 56 to connect the output of the syndrome computation circuit 54 directly to the error locator polynomial generator 42 when the decoder 34 has received code word symbols of a forward order, and controls the switch 56 to connect the output of the syndrome computation circuit 54 to the syndrome conversion unit 58 when the decoder 34 has received as input reverse order code word symbols c'(x). That is, the controller 60 controls the switch 56 to apply the S(k) output of the syndrome computation circuit 54 directly to the error locator polynomial generator 42 and controls the switch to apply the S~(−k) output of the syndrome computation circuit to the syndrome conversion unit 58. The syndrome conversion unit 58 converts the reverse directional syndromes S~(−k) to syndromes S(k). It will be appreciated that the switch 56 and/or conversion unit 58 could be placed inside the syndrome generator 40 in an alternative implementation.

Figure 3:
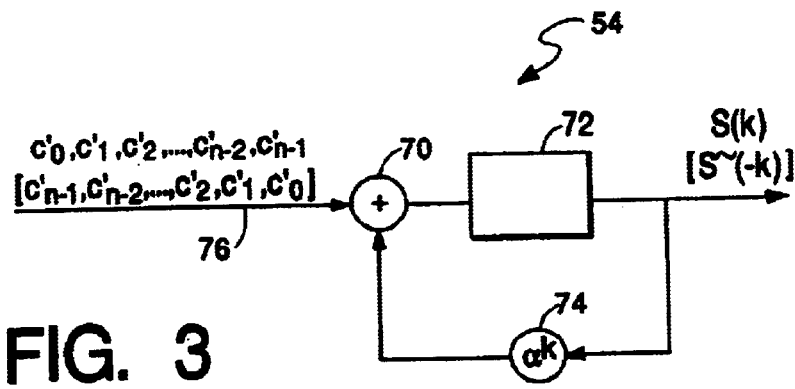
FIG. 3 is a circuit diagram of the syndrome computation unit (shown in FIG. 2), the syndrome computation circuit for generating syndromes from code words of both forward and reverse order.

Referring to FIG. 3, the syndrome computation circuit 54 includes an adder 70, a register 72 and a finite field multiplier 74. The received word c'(x) is provided, coefficient by coefficient, from highest order coefficient to lowest order coefficient, as a syndrome computation circuit input 76 to the adder 70. The output from the multiplier 74 is provided as the second input to the adder 70. The adder 70 XORs, bit by bit, the correspondingly ordered bits of its two inputs. The output of the adder 70 is stored in the register 72. Each output of register 72 is provided, bit by bit, to the multiplier 74 until all of the symbols of the received code word c'(x) have been clocked through the circuit 54. The syndrome that remains in the register 72 is subsequently clocked out and tested for a zero or non-zero condition by the controller 60 (FIG. 2) or a separate St zero compare unit.

For an r-redundant symbol Reed-Solomon code, the circuit 54 computes r consecutive roots of the form $c'(\alpha^k)$ for $k=L, L+1, \ldots, L+r-1$. Thus, when the circuit 54 is used to compute forward directional syndrome values, the coefficients of the received code word polynomial c'(x) 76 are provided as inputs to each given adder 70 in sequence, starting with the highest order term first. After the last coefficient has been received, the register 72 contains a syndrome value S(k). When the circuit 54 is used to compute reverse directional syndrome values, the coefficients of the received code word polynomial c'(x) 76 are provided as inputs to each given adder 70 in sequence, starting with the lowest order term first (as shown in brackets). After the last coefficient has been received, the register 72 contains the syndrome value S~(−k). In all other aspects, the syndrome computation is the same for both the reverse and forward order code word coefficients. The sequential evaluation of the code word of n−1 requires n cycles of the multiplier 74. The set of r syndromes can be computed for $\alpha^k$, k=0 to r−1 by performing r computations in parallel using r constant finite field multipliers 74 and r adders 70, as is known in the art.

Figure 4:
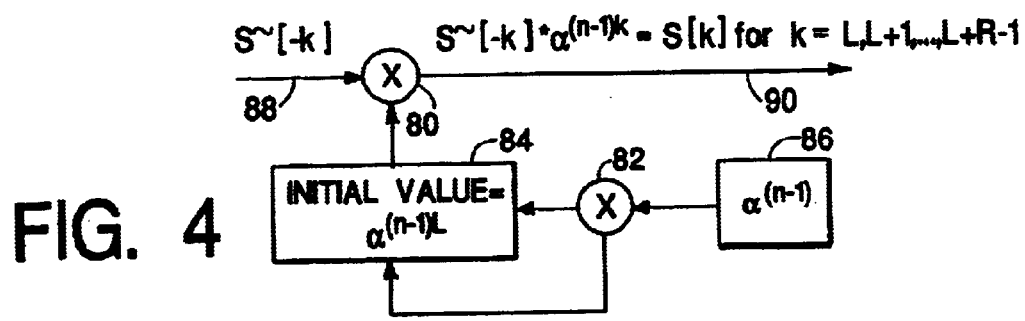
FIG. 4 is a circuit diagram of the syndrome conversion unit shown in FIG. 2.

Referring to FIG. 4, the syndrome conversion unit 58 for converting values of S~(−k) to S(k) according to the above-defined relationship of Eq. 10 includes two multipliers, a first multiplier 80 and a second multiplier 82, as well as a register 84 and a stored constant 86. An input value S~(−k) for k equal to L 88 is received and multiplied by the contents of the register 84, which is initialized to a factor $\alpha^{(n-1)L}$, by the first multiplier 80 to produce an output value 90. In the first computational pass, the output value 90 is $S\tilde{\ }(-k)*\alpha^{(n-1)L}$, which is equal to S(k) for k=L. For the next input value S~(−k), where k=L+1, the initial value $\alpha^{(n-1)L}$ is multiplied by a constant $\alpha^{(n-1)}$ and the product value is multiplied by S~(−k) to produce the output value $S\tilde{\ }(-k)*\alpha^{(n-1)(L+1)}$, which is equal to S[k] for k=L+1. In each successive iteration, i.e., for each successive value of S~(−k) for L+2 through L+R−1, the product value in the register is updated with the results of multiplication of the constant and the register value, and the successive value of S~(−k) currently being processed is multiplied by the updated contents of the register until all L+R values of k have been processed for the syndromes S~(−k). Alternatively, if the number of syndromes is not too large, constant multipliers $\alpha^{(n-1)k}$ for k=L, L+1, . . . , L+R−1 can be pre-stored to modify S~(−k) to yield S(k).

The mechanism illustrated in FIG. 4 converts the reverse directional syndromes S~(−k) to syndromes S(k). Once the syndromes S(k) have been produced from S~(k) in this manner, the remainder of the decoding procedure is as described above. The syndromes S(k), in conjunction with the other R−1 syndromes, are used by the error locator polynomial generator 14 (FIG. 1) to calculate the coefficients of the error locator polynomial $\sigma^{(x)}$.

Figure 5:
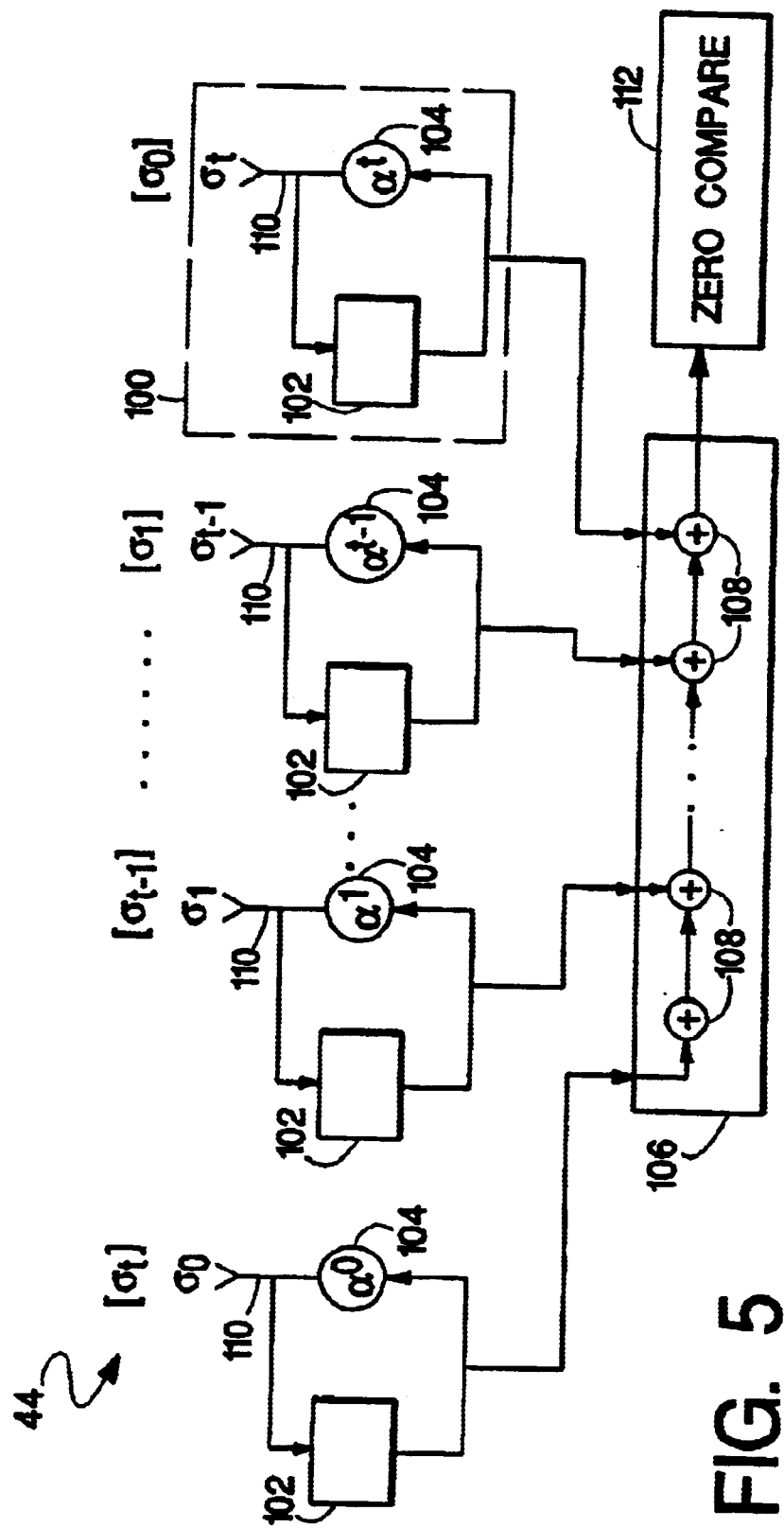
FIG. 5 is a block diagram of a Chien search circuit employed by the bidirectional Reed-Solomon decoder of FIG. 2.

Referring to FIG. 5, a conventional Chien search circuit for implementing the error location computation circuit 44 of FIG. 2 is shown. The Chien search circuit includes t+1 number of multiplier circuits 100, each including a register 102 coupled to a Galois Field multiplier 104 for multiplying the contents of the register 102 by the corresponding power of α and providing feedback into the register 102. Coupled to the multiplier circuits 100 is a summation unit 106, which includes t modulo 2 adders (XOR gates) 108 serially connected to one another and also connected to the outputs of the registers 102. Alternatively, the summation units may be implemented as an XOR tree to reduce XOR delay. An additional input to each register 102 is the corresponding coefficient of the error locator polynomial (of Eq. 3) 110. The coefficients 110 are presented to the registers 102 with the highest order coefficient first and the lowest coefficient last. Initially, these coefficients are parallel-loaded into their corresponding registers 102. Thereafter, the registers 102 are clocked by the controller 60 to form in the registers 102 the values $\sigma_0\alpha^0$, $\sigma_1\alpha^1$, $\sigma_2\alpha^2$, $\sigma_3\alpha^3$, ..., $\sigma_t\alpha^t$. That is, each coefficient $\sigma_j$ is multiplied by the appropriate multiplier $\alpha^j$ 104 and the resulting value is stored in the register 102. The stored values are summed by the adders 108 and compared to zero by a zero compare unit 112. If the result of the zero compare unit 112 indicates a value of zero, then that value of x is a root and therefore corresponds to an error location. The actual location of the error may be established by an at counter in the controller 60.

The circuitry of the Chien search circuit is clocked n times to evaluate n values of x, i.e., $x=\alpha^0, \ldots, \alpha^{n-1}$, to test for all powers of α. Thus, the next clocking of coefficients through the circuit multiplies $\alpha^i$ times the contents of the particular register 102 to which the $\alpha^i$ multiplier is coupled, e.g., $\alpha^1$ multiplied by the stored $\sigma_1\alpha^1$ to give $\sigma_1\alpha^2$.

In a second, alternative approach, the decoder 34 relies on a symmetric property of the generator polynomial g(x) to accommodate the reverse order code word. That is, for the selected values of L, the generating polynomial g(x) has a special property that $$g(x)=x^R*g(1/x) \quad \text{Eq. (11)}$$

In other words, if $$g(x)=g_R*x^R+g_{R-1}*x^{R-1}+g_{R-2}*x^{R-2}+g_{R-3}*x^{R-3}+\ldots+g_3*x^3+g_2*x^2+g_1*x+g_0 \quad \text{Eq. (12)}$$

then $$g_R=g_0=1 \text{ and } g_j=g_{R-j} \text{ for } j=0, 1, \ldots, R/2.$$

This result signifies that the coefficients are "symmetrical". Thus, if a code word $$c(x)=c_0+c_1x+\ldots+C_{n-1}x_{n-1}=m(x)*g(x) \quad \text{Eq. (13)}$$

then the reverse order code word is $$c^\sim(x)=x^{(n-1)}*c(1/x)=x^{(n-1)}*m(1/x)*g(1/x)=\{x^{(n-R-1)}*m(1/x)\}*\{x^R*g(1/x)\}=\{x^{(n-R-1)}*m(1/x)\}*g(x),$$

or $$c^{18}(x)=c_{n-1}+c_{n-2}x+c_{n-3}x^2+\ldots+c_1x^{n-2}+c_0x^{n-1} \quad \text{Eq. (14)}$$

If $x^{n-1}$ is factored out of Eq. (14), then c~(x) becomes $$c^\sim(x) = x^{n-1}(c_{n-1}x^{-(n-1)} + c_{n-2}x^{-(n-2)} + c_{n-3}x^2 + \ldots + c_1x^{-1} + c_0)$$
$$= x^{n-1}c(1/x)$$
$$= x^{n-1}c(x^{-1})$$
$$= x^{n-1}m(1/x)g(1/x)$$

Therefore, $$g(1/x)=x^{-R}+g_{R-1}x^{-R-1}+\ldots+g_1x^{-1}+1 \quad \text{Eq. (15)}$$

and $$x^Rg(1/x)=1+g_{R-1}x^{R-1}+\ldots+g_1x^{R-1}+1=g(x) \quad \text{Eq. (16)}$$

and $$x^{n-1-R}m(1/x)x^Rg(1/x)=x^{n-1-R}m(1/x)g(x) \quad \text{Eq. (17)}$$

Therefore, the reverse order code word is also a code word of the original Reed-Solomon code. Consequently, all the decoding operations applicable to a corrupted forward order code word can be applied to the corrupted reverse order code word. That is, the reverse order code word c~(x) is a valid (albeit different) code word, and syndrome values are zero for the forward and reverse order code words. Because the error locations are not the same, however, an adjustment must be made need to the error location found for the reverse order code word. Error locations in c(x) and c~(x) are related by $$e_j=n-1-e_j^* \quad \text{Eq. (18)}$$

where $e_j$ is the error location found by the forward order retrieved code word c(x) and $e_j^*$ is the location of the same error when decoding using the same corrupted code word retrieved in reverse order, i.e., c~(x). For example, an error in location 7 (i.e., $e_j$=7) in the forward direction is an error in location n−8 in the reverse direction.

Figure 6:
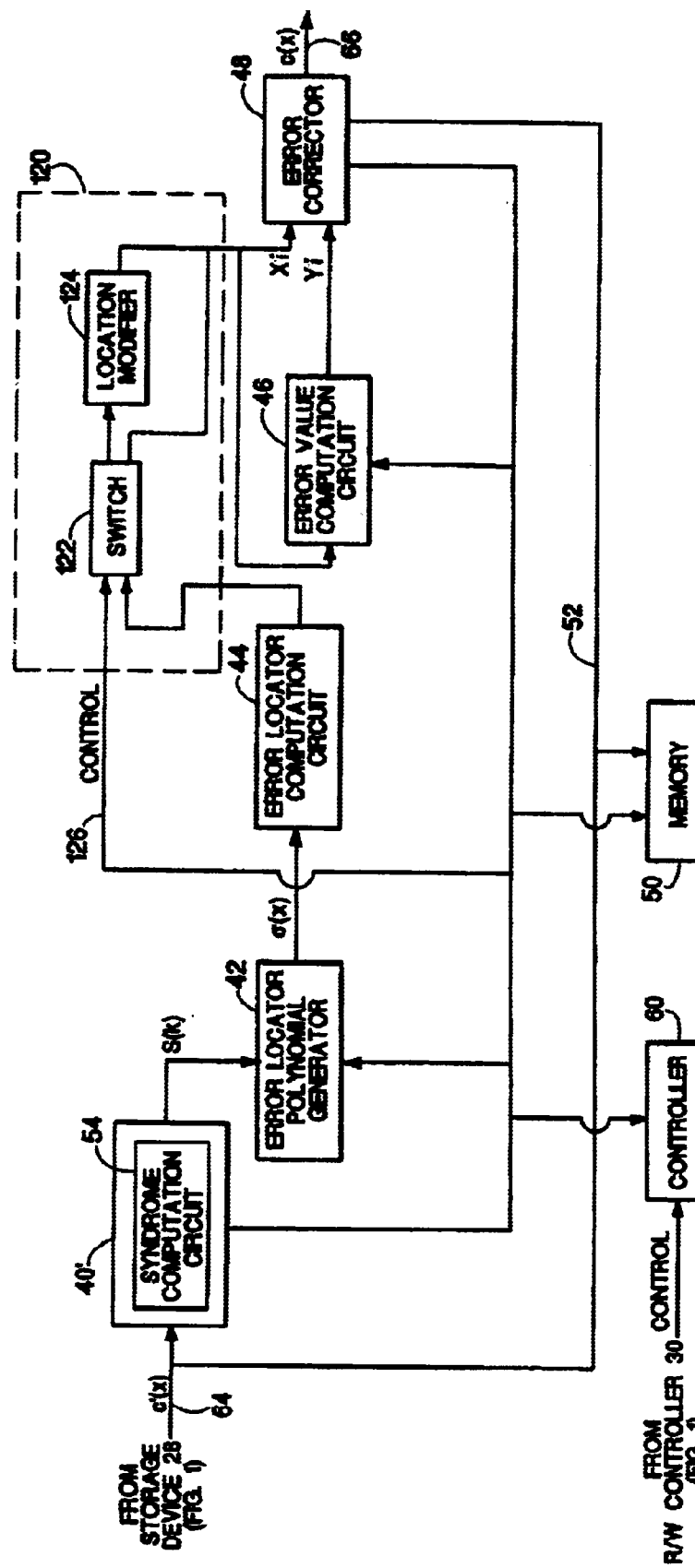
FIG. 6 is a block diagram of an alternative bidirectional Reed Solomon decoder having an error location modifier for translating an error location value for a reverse order code word to an error location value for a corresponding forward order code word.

The decoder 34 of the second embodiment is as shown in FIG. 6. Referring to FIG. 6, the decoder 34 employs a conventional syndrome generator 40' to generate syndromes. Other decoder units are the same as in FIG. 2 and like reference numerals are used to indicate like units. The syndrome generator 40' includes only the syndrome computation circuit 54 for syndrome generation. Thus, the reverse directional syndromes generated by the syndrome computation circuit are provided to subsequent decoder blocks without the benefit of conversion, as was performed by the first embodiment. Rather, the effect of the reverse order nature of the code word is dealt with by adjusting the error location determined by the error location computation circuit 44 for the error locator polynomial produced by the error locator polynomial generator 42, i.e., the reverse directional error locator polynomial, in the manner described above. Accordingly, therefore, the decoder 34 includes a location adjustment unit 120, which includes an error location modifier selection switch 122 and an error location modifier 124. Although depicted as an independent functional unit, it will be appreciated that the error adjustment function could by performed by the controller 60. The error location value determined by unit 44 and a control signal 126 from the controller 60 are provided to the switch 122, which serves to pass the error location value to the location modifier if the code word being processed by the decoder is a reverse order code word, that is, if the error location is $e_j^*$. The location modifier determines the forward order error location $e_j$ from $e_j^*$ using the relationship defined by Eq. 18. The modified error location value (now $e_j$) is transferred to units 46 and 48 for use in processing by those units. If the code word is of a forward order, the controller 60 controls the switch 122 (via the control signal 126) to pass the error location value (in this case, already equal to $e_j$) directly to units 46 and 48 without modification. With the exception of the location adjustment for the reverse order code word, then, the decoder 34 can be said to operate as a conventional decoder.

The first approach (i.e., using syndrome conversion) is slightly more complex than that of the second. Therefore, the second approach may be preferred in applications in which simplicity is important. The first approach is useful for the pre-existing decoder which directly amends the corrupted code word and cannot be easily modified to insert an error location adjustment between the decoding step of error location determination and the subsequent decoding steps of error value computation and code word error correction (performed by units 44, 46 and 48, respectively).

Additional embodiments of the invention are contemplated. For example, the exponent of the root α could be mapped to the error location $e_j$ by using the reciprocal of the error locator polynomial for the reversed order coefficients, for the error location determination. With reference to error location computation circuit 44 as depicted in FIG. 5, the coefficients of the reverse directional error locator polynomial, $\sigma^{(x)}=\sigma_0+\sigma_1 x+\sigma_2 x^2+ \ldots +\sigma_{t-3}x^{t-3}+\sigma_{t-2}x^{t-2}+\sigma_{t-1}x^{t-1}+\sigma_t x^t$, may be provided to the error location computation circuit 44 in reverse order. Thus, the reverse directional error locator polynomial with reverse order coefficients, denoted as the reciprocal error locator polynomial $\sigma^-(x)$, is of the form:

$$\sigma^-(x)=\sigma_t+\sigma_{t-1}x+\sigma_{t-2}x^2+\sigma_{t-3}x^3+ \ldots +\sigma_2 x^{t-2}+\sigma_1 x^{t-1}+\sigma_0 x^t \quad \text{Eq. (19)}$$

Using $\sigma^{18}(x)$, the order in which the coefficients are applied to circuits 100 is changed from the forward order $\sigma_0, \sigma_1, \sigma_2, \ldots, \sigma_{t-3}, \sigma_{t-2}, \sigma_{t-1}, \sigma_t$ to the reverse order $\sigma_t, \sigma_{t-1}, \sigma_{t-2}, \sigma_{t-3}, \ldots, \sigma_2, \sigma_1, \sigma_0$ (the latter reverse order coefficients being shown in brackets). Once the roots of $\sigma^-(x)$ have been found, mapping the error locations to the error locations for the forward directional error locator polynomial $\sigma(x)$ involves two location adjustments or translations instead of one as described above with reference to FIG. 6. To obtain the root locations of the roots for the reverse directional $\sigma(x)$ from the root locations of the roots obtained for $\sigma^{18}(x)$, the root $\alpha^j$ becomes $\alpha^{-j}$ and therefore location $e_j^*$ becomes $-e_j^*$. To further obtain the roots for the forward directional $\sigma(x)$ from the root locations of the reverse directional $\sigma(x)$ is as described for the second approach (error location adjustion). That is, $e_j$ is equal to $n-1-e_j^*$ (in accordance with Eq. 18) which, for $-e_j^*$, becomes $n-1+e_j^*$.

It is to be understood that while the invention has been described in conjunction with the detailed description thereof, the foregoing description is intended to illustrate and not limit the scope of the invention, which is defined by the scope of the appended claims. Other embodiments are within the scope of the following claims.

What is claimed is:

1. A method of processing a code word comprised of symbols arranged in a forward order, the method comprising:

receiving, from a storage device, symbols of a code word in a reverse order that is opposite the forward order, the symbols received in the reverse order comprising reverse order symbols; and performing a decoding procedure on the reverse order symbols by processing the symbols in the reverse order, the decoding procedure being performed using a single syndrome generator that is operable on both reverse order symbols and forward order symbols.

2. The method of claim 1, wherein the code word is a Reed-Solomon code word.

3. The method of claim 2, wherein performing a decoding procedure on the reverse order symbols comprises:

generating reverse directional syndrome values from the reverse order symbols.

4. The method of claim 3, wherein performing a decoding procedure on the reverse order symbols further comprises:

converting the reverse directional syndrome values to syndrome values that correspond to syndrome values that would be generated for the symbols if the symbols were to be received in the order in which the symbols are normally received.

5. The method of claim 4, wherein the code word is an m-bit n-symbol code word having R redundancy symbols, and a value L is defined as $-(R-1)/2$ for odd values of R and $2^{(m-1)}-R/2$ for even values of R, the value L comprising a constant of a Galois field factor of a generator polynomial, the code word being a multiple of the generator polynomial.

6. The method of claim 5, wherein converting comprises:

multiplying a first one of the reverse directional syndrome values by a first Galois field element α of a power $(n-1)*L$;

storing the result of the multiplication as a product value; and for each successive one of the reverse directional syndrome values, updating the product value by multiplying the product value by a second field element α of a power $n-1$.

7. The method of claim 3, wherein performing a decoding procedure on the reverse order symbols comprises:

determining error locator polynomial coefficients from the reverse directional syndromes; and reversing the order in which the error locator coefficients are applied to an error location computation unit.

8. The method of claim 1, wherein performing a decoding procedure on the reverse order symbols comprises:

determining that an error has occurred in at least one of the reverse order symbols;

determining an error location for the error; and adjusting the error location for the at least one of the reverse order symbols to an error location that corresponds to an error location that would be determined if the symbols were to be received in the order in which the symbols are normally received.

9. The method of claim 1, further comprising:

receiving from a storage device symbols of a code word in an order in which the symbols are normally received; and performing the decoding procedure on the code word.

10. A method of processing a code word stored on a storage device, the code word comprising symbols stored in a forward order, the method comprising:

reading symbols of the code word from a storage device in the forward order or in a reverse order that is opposite the forward order; and decoding the code word;

wherein, in a case that the symbols are read in the reverse order, the code word is decoded by processing the symbols in the reverse order, decoding being performed using a single syndrome generator that is operable on both reverse order symbols and forward order symbols.

11. The method of claim 10, further comprising:
determining if the symbols are read in the order in which the symbols are normally read or in the reverse order from that in which the symbols are normally read.

12. The method of claim 11, further comprising:
performing a decoding procedure on the code word if it is determined that the symbols are read in the order in which the symbols are normally read.

13. The method of claim 11, further comprising:
performing a decoding procedure on the code word if it is determined that the symbols are read in the reverse order from that in which the symbols are normally read.

14. The method of claim 13, wherein the code word is a Reed-Solomon code word.

15. The method of claim 14, wherein performing a decoding procedure on the code word comprises:
generating reverse directional syndrome values from the reverse order symbols; and
converting the reverse directional syndrome values to syndrome values corresponding to syndrome values that would be generated if the symbols were to be read in the order in which the symbols are normally read.

16. The method of claim 15, wherein the code word is an m-bit n-symbol code word having R redundancy symbols, and a value L is defined as $-(R-1)/2$ for odd values of R and $2^{(m-1)}-R/2$ for even values of R, the value L comprising a constant of a Galois field factor of a generator polynomial, the code word being a multiple of the generator polynomial.

17. The method of claim 16, wherein converting comprises:
multiplying a first one of the reverse directional syndrome values by a first Galois field element $\alpha$ of a power $(n-1)*L$;
storing the result of the multiplication as a product value; and
for each successive one of the reverse directional syndrome values, updating the product value by multiplying the product value by a second field element $\alpha$ of a power $n-1$.

18. The method of claim 14, wherein performing a decoding procedure on the code word comprises:
determining that an error has occurred in at least one of the reverse order symbols;
determining an error location for the error; and
adjusting the error location for the at least one of the reverse order symbols to a error location that corresponds to an error location that would be determined if the symbols were to be read in the order in which the symbols are normally read.

19. The method of claim 14, wherein performing a decoding procedure on the code word comprises:
determining error locator polynomial coefficients from the reverse directional syndromes; and
reversing the order in which the error locator coefficients are applied to an error location computation unit.

20. A decoder comprising:
a controller; and
circuitry, responsive to the controller, which performs a bidirectional decoding on symbols of a Reed-Solomon code word, the circuitry receiving the symbols in one of a forward order and a reverse order and, if the symbols are received in the reverse order, performing decoding by processing the symbols in the reverse order, decoding being performed using a single syndrome generator that is operable on both reverse order symbols and forward order symbols.

21. The decoder of claim 20, wherein the controller determines if the symbols are received in the reverse order, and wherein the circuitry comprises:
a syndrome generator which generates reverse directional syndrome values for the code word when the symbols are determined to be reverse order symbols, the syndrome generator including a syndrome conversion unit which converts the reverse directional syndrome values to syndrome values corresponding to syndrome values that would be generated for the symbols if the symbols were received in the forward order.

22. The decoder of claim 20, wherein the controller determines if the symbols are received in the reverse order, and wherein the circuitry comprises:
circuitry which determines an error location value of an error occurring in the code word; and
an error location adjustment unit which modifies the error location value when the symbols are determined to be reverse order symbols.

23. A storage controller comprising:
a controller which reads a code word from a storage device in either a forward or a reverse direction; and
a decoder which decodes the code word in either the forward direction or the reverse direction;
wherein, if the controller reads the code word from the storage device in the reverse direction, the decoder decodes the code word by processing data from the code word ordered in the reverse direction, decoding being performed using a single syndrome generator that is operable on both reverse order symbols and forward order symbols.

24. A data storage system comprising:
a storage device;
a controller which reads a code word from the storage device in either a forward or a reverse direction; and
a decoder which decodes the code word as it is read from the storage device in either the forward direction or the reverse direction;
wherein, if the controller reads the code word in the reverse direction, the decoder decodes the code word by processing data from the code word ordered in the reverse direction, decoding being performed using a single syndrome generator that is operable on both reverse order symbols and forward order symbols.

25. The data storage system of claim 24, wherein the storage device comprises a magnetic tape.

26. A method of processing a code word, comprising:
receiving, from a storage device, symbols of a code word, the symbols being stored in a forward order and being received in a reverse order that is opposite the forward order, the symbols received in the reverse order comprising reverse order symbols; and
performing a decoding procedure on the reverse order symbols, the decoding procedure comprising generating reverse directional syndrome values from the reverse order symbols and decoding the reverse order symbols based on the reverse directional syndrome values, the decoding procedure being performed using a single syndrome generator that is operable on both reverse order symbols and forward order symbols.

27. The method of claim 26, wherein performing a decoding procedure on the reverse order symbols further comprises:
converting the reverse directional syndrome values to syndrome values that correspond to syndrome values that would be generated for the symbols if the symbols were to be received in the forward order.

28. The method of claim 27, wherein the code word is an m-bit n-symbol code word having R redundancy symbols, and a value L is defined as $-(R-1)/2$ for odd values of R and $2^{(m-1)}-R/2$ for even values of R, the value L comprising a constant of a Galois field factor of a generator polynomial, the code word being a multiple of the generator polynomial.

29. The method of claim 28, wherein converting comprises:
multiplying a first one of the reverse directional syndrome values by a first Galois field element $\alpha$ of a power $(n-1)*L$;
storing the result of the multiplication as a product value; and
for each successive one of the reverse directional syndrome values, updating the product value by multiplying the product value by a second field element $\alpha$ of a power $n-1$.

30. A mass storage system that stores symbols of a code word in a forward order, the mass storage system comprising:
receiving means for receiving symbols of the code word in a reverse order that is opposite the forward order, the symbols received in the reverse order comprising reverse order symbols; and
decoding means for decoding the reverse order symbols in the reverse order, the decoding means comprising a single syndrome generator that is operable on both reverse order symbols and forward order symbols.

31. The mass storage system of claim 30, wherein the decoding means comprises:
determining means for determining that an error has occurred in at least one of the reverse order symbols; and
locating means for locating the error.

32. The mass storage system of claim 30, wherein the decoding means is also for decoding forward order symbols.

33. The mass storage system of claim 30, wherein the code word is a Reed-Solomon code word and the decoding means further comprises:
generating means for generating reverse directional syndrome values based on the reverse order symbols; and
converting means for converting the reverse directional syndrome values to syndrome values that would be generated for the reverse order symbols received in the forward order.

34. The mass storage system of claim 30, wherein the Reed-Solomon code word is an m-bit n-symbol code word having R redundancy symbols, and a value L corresponds to $-(R-1)/2$ for odd values of R and $2^{(m-1)}-R/2$ for even values of R, the value L comprising a constant of a Galois field factor of a generator polynomial, the Reed-Solomon code word being a multiple of the generator polynomial.

35. The mass storage system of claim 34, wherein the converting means comprises:
multiplying means for multiplying a first one of the reverse directional syndrome values by a first Galois field element $\alpha$ of a power $(n-1)*L$;
storing means for storing an output of the multiplying means as a product value; and
updating means for updating the product value by multiplying the product value by a second field element $\alpha$ of a power $n-1$, for each successive one of the reverse directional syndrome values.

36. A method comprising:
receiving, from a storage device, symbols of a Reed-Solomon code word in a reverse order, the symbols being stored on the storage device in a forward order that is opposite the reverse order, the symbols received in the reverse order comprising reverse order symbols; and
performing a decoding procedure on the reverse order symbols by processing the symbols in the reverse order, the decoding procedure being performed using a single syndrome generator that is operable on both reverse order symbols and forward order symbols;
wherein the decoding procedure comprises:
generating reverse directional syndrome values based on the reverse order symbols; and
converting the reverse directional syndrome values to syndrome values that correspond to syndrome values that would be generated if the reverse order symbols were received in forward order.

37. The method of claim 36, wherein:
the Reed-Solomon code word is an m-bit n-symbol Reed-Solomon code word having R redundancy symbols, and a value L corresponds to $-(R-1)/2$ for odd values of R and $2^{(m-1)}-R/2$ for even values of R, the value L comprising a constant of a Galois field factor of a generator polynomial, the code word being a multiple of the generator polynomial; and
wherein converting comprises:
multiplying a first one of the reverse directional syndrome values by a first Galois field element $\alpha$ of a power $(n-1)*L$;
storing a result of the multiplying as a product value; and
for each successive one of the reverse directional syndrome values, updating the product value by multiplying the product value by a second field element $\alpha$ of a power $n-1$.

38. The method of claim 36, wherein the decoding procedure further comprises:
determining that an error has occurred in at least one of the reverse order symbols;
determining a location of the error; and
adjusting the location of the error.

39. The method of claim 36, further comprising:
receiving, from a storage device, symbols of a Reed-Solomon code word in a forward order, the symbols received in the forward order comprising forward order symbols; and
performing a decoding procedure on the forward order symbols using the single syndrome generator.

40. A storage controller comprising:
a controller that is operable to sequentially read a code word from a storage device in either a forward direction to produce forward order symbols or a reverse direction to produce reverse order symbols, the reverse direction being opposite the forward direction; and
a decoder that is operable to decode the code word using at least one of the forward order symbols and the reverse order symbols, the decoder comprising a single syndrome generator that is operable on the reverse order symbols to produce a reverse directional syndrome and that is operable on the forward order symbols to produce a forward directional syndrome.

41. The storage controller of claim 40, wherein:
the controller determines if the symbols are received in the reverse direction; and
the syndrome generator comprises a syndrome conversion unit for converting the reverse directional syndrome to a corresponding forward directional syndrome.

* * * * *